(12) United States Patent
Liu et al.

(10) Patent No.: US 8,663,754 B2
(45) Date of Patent: Mar. 4, 2014

(54) PULSED LASER MICRO-DEPOSITION PATTERN FORMATION

(75) Inventors: Bing Liu, Ann Arbor, MI (US); Zhendong Hu, Ann Arbor, MI (US); Makoto Murakami, Ann Arbor, MI (US); Jingzhou Xu, Ann Arbor, MI (US); Yong Che, Ann Arbor, MI (US)

(73) Assignee: IMRA America, Inc., Ann Arbor, MI (US)

( * ) Notice: Subject to any disclaimer, the term of this patent is extended or adjusted under 35 U.S.C. 154(b) by 795 days.

(21) Appl. No.: 12/400,438

(22) Filed: Mar. 9, 2009

(65) Prior Publication Data

US 2010/0227133 A1    Sep. 9, 2010

(51) Int. Cl.
| | |
|---|---|
| C23C 14/28 | (2006.01) |
| C08J 7/04 | (2006.01) |
| B05D 5/06 | (2006.01) |
| B05D 5/12 | (2006.01) |
| B23K 26/00 | (2006.01) |

(52) U.S. Cl.
USPC ........... 427/596; 427/510; 427/520; 427/597; 427/67; 427/108; 219/121.68; 219/121.69; 219/121.66

(58) Field of Classification Search
USPC ................................. 427/596, 586
See application file for complete search history.

(56) References Cited

U.S. PATENT DOCUMENTS

| | | | |
|---|---|---|---|
| 4,701,592 A * | 10/1987 | Cheung | 219/121.77 |
| 4,752,455 A | 6/1988 | Mayer | |
| 4,987,006 A | 1/1991 | Williams | |
| 5,173,441 A | 12/1992 | Yu | |
| 6,159,832 A | 12/2000 | Mayer | |
| 6,177,151 B1 * | 1/2001 | Chrisey et al. | 427/596 |
| 6,312,768 B1 * | 11/2001 | Rode et al. | 427/596 |
| 6,395,350 B1 * | 5/2002 | Balkus et al. | 427/556 |

(Continued)

FOREIGN PATENT DOCUMENTS

| | | | |
|---|---|---|---|
| JP | 2005-79245 A | 3/2005 | |
| WO | 98/22635 A1 | 5/1998 | |
| WO | WO 9822635 A1 * | 5/1998 | .............. C23C 14/28 |
| WO | WO2008/091898 A1 | 7/2008 | |

OTHER PUBLICATIONS

Salim et al. Formation of Droplets on Thin Film Surface in Pulsed Laser Deposition Using Metal Targets; Quarterly Journal of Japan Welding Society, vol. 21. No. 3. pp. 338-343 (2003).*

(Continued)

*Primary Examiner* — Dah-Wei Yuan
*Assistant Examiner* — Jose Hernandez-Diaz
(74) *Attorney, Agent, or Firm* — Sughrue Mion, PLLC

(57) ABSTRACT

A method of forming patterns on transparent substrates using a pulsed laser is disclosed. Various embodiments include an ultrashort pulsed laser, a substrate that is transparent to the laser wavelength, and a target plate. The laser beam is guided through the transparent substrate and focused on the target surface. The target material is ablated by the laser and is deposited on the opposite substrate surface. A pattern, for example a gray scale image, is formed by scanning the laser beam relative to the target. Variations of the laser beam scan speed and scan line density control the material deposition and change the optical properties of the deposited patterns, creating a visual effect of gray scale. In some embodiments patterns may be formed on a portion of a microelectronic device during a fabrication process. In some embodiments high repetition rate picoseconds and nanosecond sources are configured to produce the patterns.

38 Claims, 5 Drawing Sheets

(56) References Cited

U.S. PATENT DOCUMENTS

| | | | |
|---|---|---|---|
| 6,766,764 | B1 | 7/2004 | Chrisey |
| 6,822,189 | B2 * | 11/2004 | Hong et al. ............... 219/121.69 |
| 7,608,308 | B2 * | 10/2009 | Liu et al. ........................ 427/596 |
| 2003/0134157 | A1 * | 7/2003 | Leblans et al. ................ 428/702 |
| 2004/0250769 | A1 * | 12/2004 | Freeman et al. ............. 118/718 |
| 2005/0276931 | A1 | 12/2005 | Che |
| 2007/0243328 | A1 | 10/2007 | Liu |
| 2008/0006524 | A1 | 1/2008 | Liu |
| 2008/0187684 | A1 | 8/2008 | Hu |
| 2008/0292808 | A1 | 11/2008 | Liu |
| 2009/0017318 | A1 * | 1/2009 | Ruuttu et al. ................. 428/457 |

OTHER PUBLICATIONS

S. Amoruso et al., "Femtosecond laser pulse irradiation of solid targets as a general route to nanoparticle formation in a vacuum", Physical Review B, vol. 71, 033406 (2005).

S. Eliezer et al., "Synthesis of nanoparticles with femtosecond laser pulses", Physical Review B, vol. 69 (2004), 144119.

Hanada et al, "LIPAA technique and its possible impact on microelectronics" (Invited Paper), Proc. SPIE, vol. 5713, 445 (2005).

Y. Hanada et al., "Selective metallization of polyimide by laser-induced plasma-assisted ablation (LIPPA)", Y. Hanada et al., Applied Physics A, 80, 111-115 (2005).

Hanada et al, "Development of practical system for laser-induced plasma-assisted ablation (LIPAA) for micromachining of glass materials", Applied Physics A, 79,1001-1003 (2004).

Hanada et al, "Colour marking of transparent materials by laser-induced-plasma-assisted ablation (LIPAA)", Journal of Physics: Conference Series 59: 687-690 (2007).

T. E. Itina et al., "Mechanisms of nanoparticle formation by short laser pulses", Proceedings of SPIE, vol. 6458, 64581U-1, (2007).

B. Liu et al., "Nanoparticle generation in ultrafast pulsed laser ablation of nickel", Applied Physics Letters, vol. 90, 044103, 2007.

B. Liu et al., "Ultrafast Pulsed Laser Ablation for Synthesis of Nanocrystals", Proc. SPIE 6460, 646014 (2007).

B. Liu et al., "Ultrafast lasers produce nanoparticles", Laser Focus World, vol. 43, 74 (2007).

* cited by examiner

PULSED LASER MICRO-DEPOSITION PATTERN FORMATION

CROSS REFERENCE TO RELATED APPLICATIONS

This application is related to U.S. Ser. No. 12/254,076, entitled "A method for fabricating thin films", filed Oct. 20, 2008. U.S. Ser. No. 12/254,076 is hereby incorporated by reference in its entirety.

FIELD OF THE INVENTION

This invention is related to pulsed laser deposition, and the formation of patterned materials therewith.

BACKGROUND OF THE INVENTION

When using a pulsed laser for patterned material deposition, methods fall into two general categories: laser-induced forward transfer (LIFT) and laser-induced backward transfer (LIBT). The ablated material is transferred to the receiving substrate in the same direction with LIFT, or in a reverse direction relative to the incident laser with LIBT. In LIFT, a target film needs to be deposited on a laser-transparent supporting substrate. The receiving substrate is placed facing the target film. The laser beam, incident from the uncoated side of the target supporting substrate, causes ablation in the target film. The ablated material is transferred forwardly in the same direction as the laser, and to the receiving substrate. In a LIBT setup, the geometry is reversed. The laser is guided through the laser-transparent receiving substrate first and focused on the target. The target can be a plate made of the desired target material. Upon ablation, the ablated material is transferred backwardly, in a reverse direction to the incident laser beam, and deposited on the receiving substrate.

Several LIFT methods are disclosed in, for example, U.S. Pat. Nos. 4,752,455 and 6,159,832 issued to Mayer, U.S. Pat. No. 4,987,006 issued to Williams et al., U.S. Pat. Nos. 6,177, 151 and 6,766,764 issued to Chrisey et al. A few LIBT methods are described in U.S. Pat. No. 5,173,441 issued to Yu et al, Japan patent 2005-79245 issued to Hanada et al., and US patent application 2007/0243328 to Liu et al.

Laser-induced-plasma assisted ablation has been used for color marking of metal targets, as disclosed by Hanata et al, "Colour marking of transparent materials by laser-induced-plasma-assisted ablation (LIPAA)", Journal of Physics: Conference Series 59 (2007), 687-690. Various lasers were tested, and produced various picosecond, nanosecond, and femtosecond outputs, with a maximum repetition rate of 10 KHz. For this RGB process it was concluded that a conventional nanosecond pulse width has great potential for high-quality and cost effective marking in the laser-marking industry.

An object of the above methods is precise and patterned deposition of materials. If applied to printing, these methods are binary and would provide an on/off effect or a visually black/white effect. In order to print a bitmap image over a large gray scale range, two requirements need to be satisfied: (i) sufficient number of gray scale levels and (ii) a practically acceptable speed of printing.

A recent international patent application, WO 2008/091898 by Shah et al., assigned to the assignee of the present application, discloses a method of ultrashort pulsed laser printing of images on solid surfaces. This method is based on surface texturing induced by ultrashort pulsed laser interaction with solid surfaces. In a range of laser fluence and exposure time (average power per unit area), several types of surface textures can be produced after laser irradiation, including ripples, pillars, pores and many types of random micro-protrusions. A controlled arrangement of these textures produces a visual effect of gray scale by scattering, trapping, and absorbing light. This method does not involve material transfer from a target to a substrate.

LIFT, LIBT, and LIPAA systems have utilized Nd:YAG, Ti:Sapphire at a 1 kHz repetition rate, and up to about 10 KHz with NdYVO$_4$ based systems. Forming patterns or images at high resolution on a macroscopic scale could take up to a thousand minutes as a result of the low repetition rates, limiting the application of these methods. Moreover, as set forth above, many systems are limited to production of binary patterns.

SUMMARY OF THE INVENTION

An objective of one or more embodiments is precise deposition of materials on transparent substrates, with both the location and thickness under control. The substrate may be a glass, or other suitable medium.

At least one embodiment provides a LIBT method for forming a pattern on a transparent medium at a high speed.

In various embodiments the location and thickness of deposited material is controlled to vary the optical density of a region of the medium such that a gray scale image is obtainable with illumination of the medium. By way of example, the location and thickness of deposited material is controlled over microscopic regions of the medium, and associated variations in reflectance over the medium create a visual effect of gray scale, and a discernible image when viewed with the un-aided eye, or at low magnification. Either ambient or controlled illumination may be utilized.

In various embodiments a receiving substrate is placed adjacent and opposite to the target plate. A laser beam is guided through the receiving substrate and is focused on the target such that the material is ablated and transferred backwardly to the receiving substrate.

Another objective is laser printing of images, including but not limited to artistic or photographic images, on transparent substrates. More particularly, with a high repetition rate ultrashort pulsed laser, both a visual effect of gray scale and a fast printing speed can be achieved.

In various embodiments the gray scales are produced by varying material deposition such that the light transmission and reflection of the printed patterns is varied depending on the thickness of the deposits. The thickness may be continuously controlled with control of laser parameters. A high repetition rate laser is utilized such that the target under the laser irradiation can receive a variable number of laser pulses over a focused spot diameter.

In various embodiments the amount of deposition is varied in two ways during printing: (i) varying the laser beam scan speed while maintaining a constant scan line density, (ii) varying the laser scan line density while maintaining a constant beam scan speed. The first way provides for printing bitmap images of art, photographs, and the like. The second way provides for printing vector graphics such as text patterns and simple geometric figures.

Various embodiments provide fast printing speed. For example, in an embodiment with a laser repetition rate of 1 MHz, an image of 2×2 square inch is printed in 20 sec to 1 min. With other lasers having 1 kHz repetition rate, such a printing would take up to a thousand minutes.

In various embodiments PLD pattern formation may be carried out in air, and without a vacuum chamber. In some embodiments vacuum or some other control of atmosphere may be utilized, for example gas flow of dry air.

The target materials can be metals, for example, steel, aluminum, or copper. Steel will provide a brownish color to the printed image. Dielectric materials, including but not limited to silicon and carbon can also be used.

Another objective is to print patterns with a functional target material. Such a material provides special functions in addition to modifying light transmission or reflection. In at least one embodiment, a target made of phosphor materials is used such that the printed image is nearly invisible under room or sun light illumination, and only under special illumination with UV light, the image becomes visible.

DETAILED DESCRIPTION OF THE INVENTION

Figure 1:
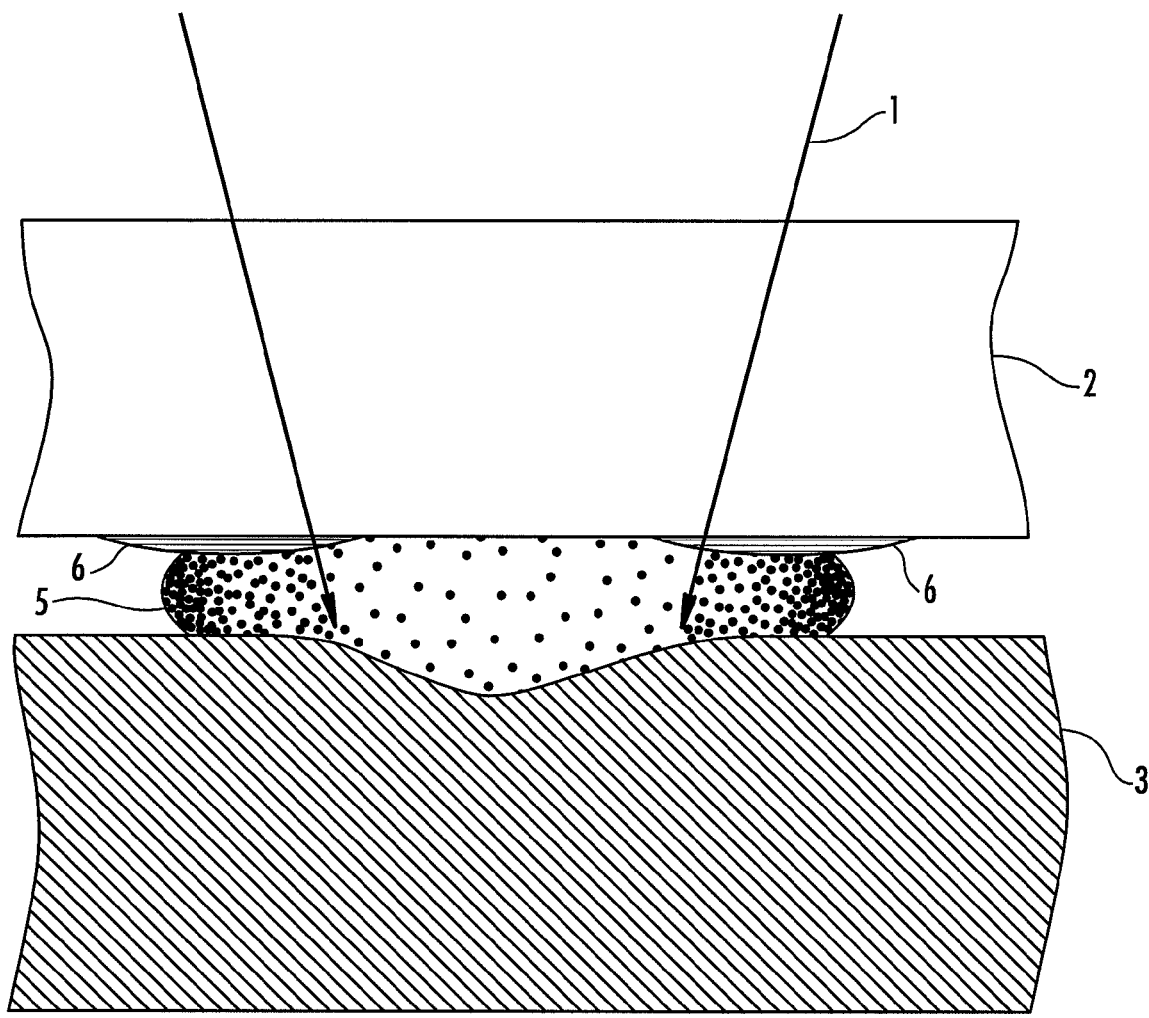
FIG. 1 schematically illustrates an arrangement for pulsed laser micro-deposition pattern formation.

FIG. 1 schematically illustrates a portion of an arrangement for pulsed laser micro-deposition pattern formation, and provides an illustration of laser-material interaction. In this example the laser beam 1 is directed through a transparent medium 2, for example a glass substrate, and is focused on the target 3. Ablation removes materials at the focal point 4 and causes a small crater (not to scale). In this example the ablated material, particularly the ejecta 5, transfers backwardly, generally propagating in a direction opposite to the laser incident direction. Material is deposited on the substrate, for example the surface that is facing the target.

In at least one embodiment the substrate is positioned near the target so that a small gap remains between the target and the receiving substrate 2. The gap width can be adjusted by inserting a spacer of different thickness between the substrate and the target. A small gap width is preferred, for example less than about 10 micrometers, to provide high image resolution. In practice, the substrate may be placed in direct contact with the target. In such case, judging from the interference fringes often appearing between a smooth target surface and the substrate, the gap width is around 1 micrometer. In some embodiments the medium and target are spaced apart by a gap that provides separation The gap may be filled with ambient air, or with flowing dry air. In some embodiment the gap may be filled with an inert gas, for example nitrogen or argon. Physical parameters, for example pressure, within the gap may be controlled.

The interference fringes between the substrate and the target have high contrast when the target surface is smooth and shiny. These fringes can degrade the quality of printing by modulating the laser fluence. One way to avoid interference effects is to use a rough target surface, for example a granular surface, to randomize the reflection off the target. In general, with a roughness greater than the laser wavelength the interference effect can be reduced to negligible levels.

Referring again to FIG. 1, deposited material is heavily concentrated near the periphery of the beam scan line (not shown). A double line 6 is formed on the receiving substrate. This is because the high temperature and high pressure under direct laser irradiation expels the ablated material sideways. Therefore, a localized region of the medium affected by the laser interaction has a one-dimensional thickness profile characterizable by a central portion of low thickness bounded by thicker portions having controlled material deposition. By way of example, a resulting total line width of the deposition is about 2-3 times of the laser focal spot size. With a laser spot size of 20 micrometer in diameter, the deposited line width is about 40-60 micrometer, yet sufficient for relatively high resolution image printing in various embodiments.

Figure 2:
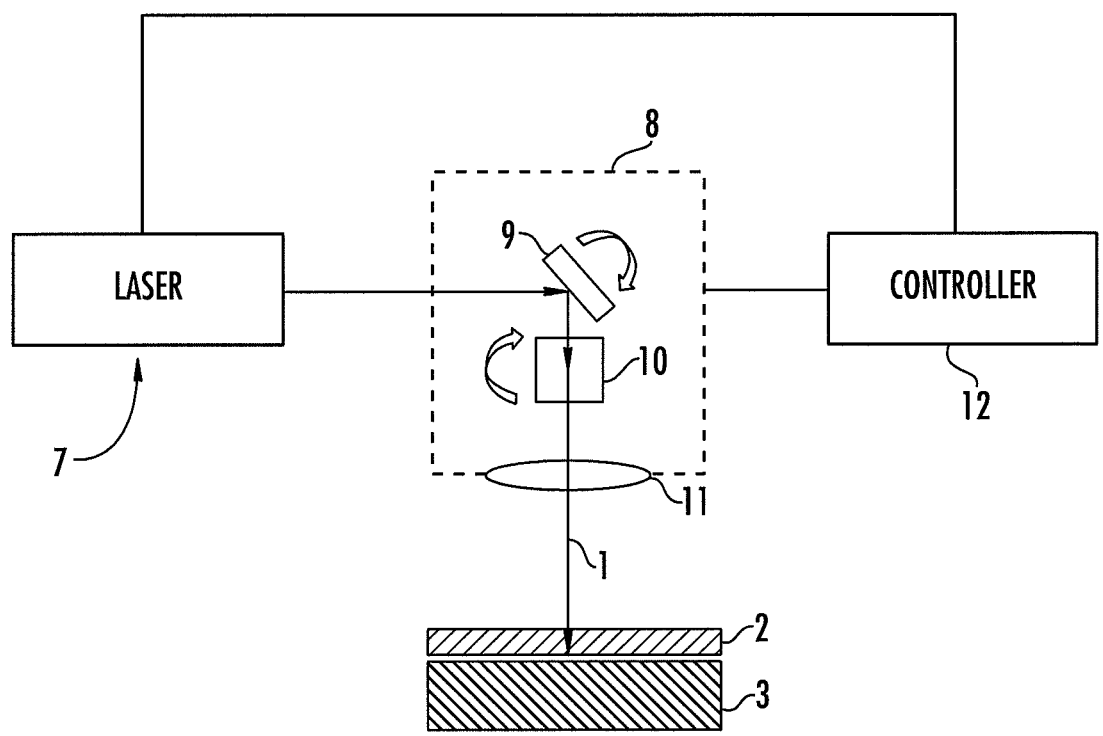
FIG. 2 schematically illustrates further details of an arrangement for pulse laser micro-deposition of materials to provide patterns of varying optical density.

FIG. 2 further illustrates an example of an arrangement for pulsed laser micro-deposition of materials to provide patterns of varying optical density. In this example, laser 7 is preferably a high repetition rate pulsed laser. A pulse selector, for example an acousto-optic or electro-optic modulator (not shown), may be connected to controller 12 and used to select pulses for delivery to the target. A beam scanner 8 is used, under computer control, to form patterns. The scanner is controllable to produce varying scan speeds. Scanner 8 may comprise two scanning mirrors 9 and 10, and a focal lens 11, for example an f-theta lens to provide a flat beam scan plane. A telecentric optical system may be utilized in some embodiments. The scanner receives computerized control signals from the controller 12. A commercially available beam scanner system can be used, such as various products available from SCANLAB America Inc., which includes a scan head, a controller with a computer interface, and a user software to load images and edit texts and geometric figures.

In various embodiments other scan mechanisms may be utilized, alone or in any suitable combination, to form predetermined spatial patterns having varying optical density. For example, acousto-optic deflectors, polygons, rotating prisms, and the like may provide for further increase in scan speeds. Some embodiments may include a combination of fast and slow deflection mechanisms to control deposition while maintaining high scan speed. For example, a first scanning mechanism may scan at a fixed rate in a first direction, and a second scanner at a second rate in a direction opposite the first.

Various scan patterns may be generated, including trepanned or dithered patterns. Such mechanisms have been proposed and utilized in laser marking, drilling, and micromachining, and may also be configured for pulsed laser micro-deposition pattern formation.

High repetition rate ultrashort lasers provide some benefits for PLD pattern formation. Compared with nanosecond pulsed laser ablation, ultrashort pulsed laser ablation requires less pulse energy to reach ablation threshold. The available ultrahigh peak power with an ultrashort pulse duration contributes to the low threshold. For example, a femtosecond pulse of a few micro-Joule has a higher peak power than a conventional nanosecond pulse of a few milli-Joule. Moreover, a reduced heat-affected zone (HAZ) at the focal spot significantly increases the energy efficiency for ablation.

IMRA America Inc., the assignee of the present application, disclosed several fiber-based chirped pulse amplification systems which have a high repetition rate above 1 MHz, an ultrashort pulse duration from 500 femtosecond to a few picoseconds, and a high average power of more than 10 watts. Various fiber configurations are available commercially, as set forth below.

With a high laser repetition rate, for example in the range of 100 kHz to above 1 MHz, the target receives multiple laser pulses in a short time interval before the beam moves away from a localized focal region. For example, with 1 MHz repetition rate, a beam scan speed of 1 m/s, and a spot size of 20 micrometer in diameter, the number of overlapping laser pulses is about 20, corresponding to about 95% overlap between adjacent spots. Multiple laser pulses with a close time separation between pulses, for example 1 microsecond or less, may produce physical effects to be considered for image formation. For example, (i) accumulation of deposition and (ii) accumulation of heat and pressure in the air gap are of consideration. With a variable laser beam scan speed, the first effect produces different light transmission and reflection due to different deposit thickness, which is preferably controlled in a continuous manner. The variation in thickness and associated changes in transmission and/or reflection creates a visual effect of gray scale. The second effect relates to the observation that the deposits are concentrated near the periphery of the laser beam path, as illustrated in FIG. 1, and will be further illustrated with example images in FIG. 3.

A high repetition rate pulsed laser is also needed for high printing speed. Conventional solid state lasers such as Q-switched lasers and ultrashort laser systems based on regenerative amplifiers provide typical repetition rates from 10 Hz to tens of kHz. Although about 20 sec to 1 min is required to print a 2×2 square inch image with 1 MHz repetition rate, approximately one thousand minutes are needed with a repetition rate of 1 kHz to have the same spatial overlap between pulses.

Various embodiments may utilize a fiber-based high repetition rate ultrashort pulsed laser, for example a model FCPA μJewel made by IMRA America Inc. The laser has a repetition rate from 100 kHz up to 5 MHz, a pulse duration of 500 fs to 10 ps, and a pulse energy up to 20 micro-Joule. With a focused beam spot of 20-30 micrometers in diameter, this laser can ablate many metals, dielectrics, and semiconductor materials.

Operation at higher repetition rates is possible. U.S. provisional application 61/120,022, entitled "Highly Rare-Earth-Doped Optical Fibers for Fiber Lasers and Amplifiers" to Dong et al., is incorporated herein by reference. Various examples disclosed in the '022 application include highly rare earth doped gain fibers having pump light absorption of up to about 5000 dB/m, and gain per unit length in the range of 0.5-5 dB/cm. Various dopant concentrations reduce Yb clustering thereby providing for high pump absorption, large gain, with low photodarkening. Such rare-earth doped fibers provide for construction of short cavity length fiber lasers, and for generation of high energy ultrashort pulses at a repetition rate exceeding 1 GHz. With availability of a GHz fiber source having increased pulse energy, an improved figure of merit can be obtained based on various combinations of pulse width, energy, spot size, and average power, and preferably with the use of an all-fiber system.

In various embodiments a repetition rate may be increased with a combination of beam splitter and optical delay lines.

Figure 3B:
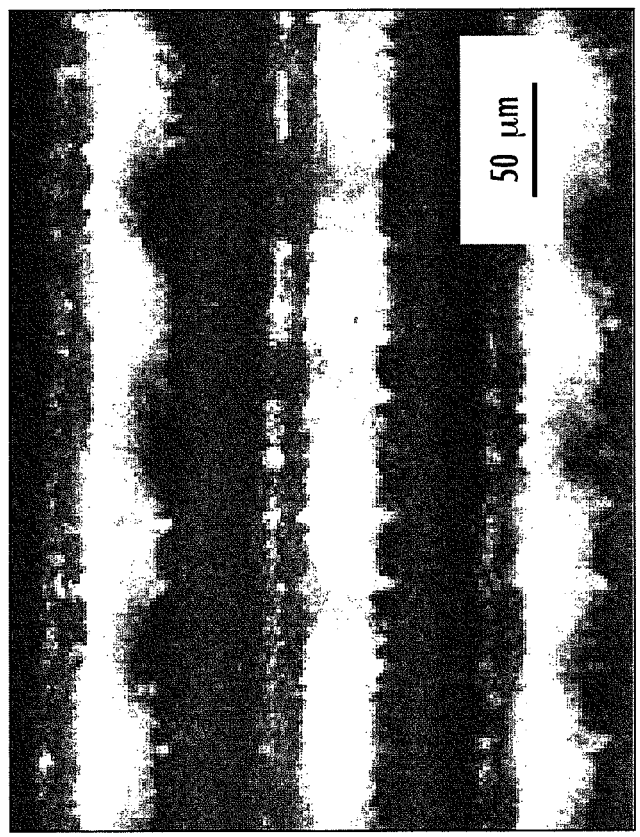
FIG. 3 is an example illustrating two optical microscope images of printed patterns.
Figure 3A:
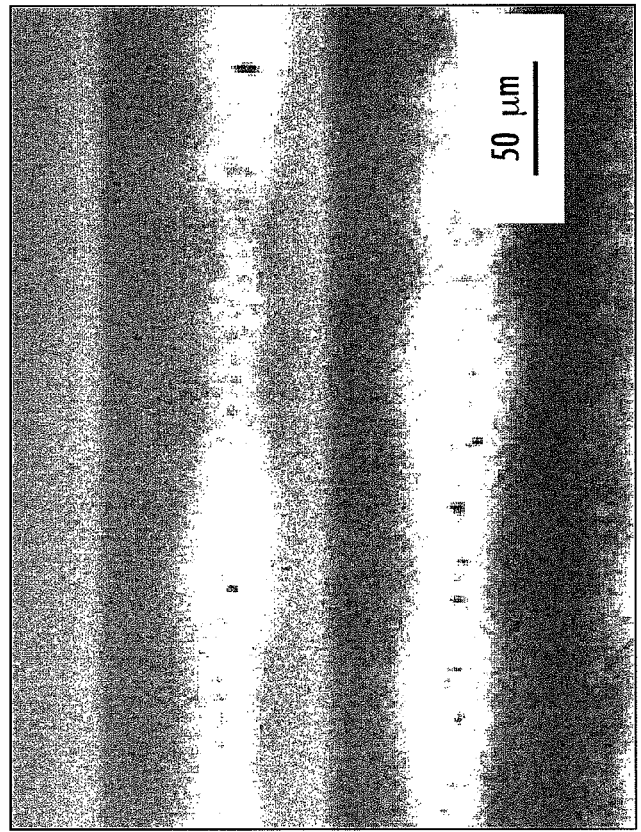
Figure 4B:
FIG. 4 is an example illustrating two images printed on 2-inch glass wafers with a steel plate as the target.
Figure 4A:

FIGS. 3 and 4 illustrate the visual effect of gray scale. FIG. 3 shows two microscopic portions with different gray levels taken from the printed artistic image shown in FIG. 4(a). In FIG. 3(a), the two bright lines are made by a fast beam scan with a scan speed of 8-10 m/s. Referring back to FIG. 1, the deposited material 6 corresponds to the region corresponds to the region between the bright lines in FIG. 3a. As explained above, the whiteness of the scan lines is due to the high temperature and high pressure under the direct illumination of the laser beam, which forces the ejecta sideways. In FIG. 3(a), because of the fast scan speed, relatively few deposits remain, particularly on the top of the image.

FIG. 3(b) shows three scan lines made with a slow scan speed of 0.2 m/s on average, where much thicker deposits formed between the lines, resulting in an overall visual effect of darkness. The white scan lines are also present. Therefore, different beam scan speeds control material deposition between the scan lines and produce the gray scale variation. In this way, a famous artistic image is printed and shown in FIG. 4(a). A nickel coin is placed beside the glass wafer to indicate the dimension.

In the above example, the number of gray levels is determined by the minimum increment of the beam scan speed and the maximum scan speed, assuming a linear dependence of deposit thickness with beam scan speed. For example, with a maximum scan speed of 10 m/s and an increment of speed of 1 mm/s, the increment of the amount of deposit is sufficiently small to produce a visually continuous gray scale FIG. 4(b) shows images of three identical text patterns with different gray scales. In this example the patterns were formed by controlling scan line density while maintaining a constant beam scan speed of 5 m/s. For the three images from the top to the bottom, the scan line densities are 4, 8, and 12 lines per millimeter, respectively. This is an example of printing vector graphics. This pattern formation technique is also suitable for filling simple geometric shapes. By varying the scan line density, the available number of gray levels can exceeds 10. In various embodiments an optical density (O.D.) of at least 1 unit (10:1) may be provided, and up to about 3-4 units.

Figure 5B:
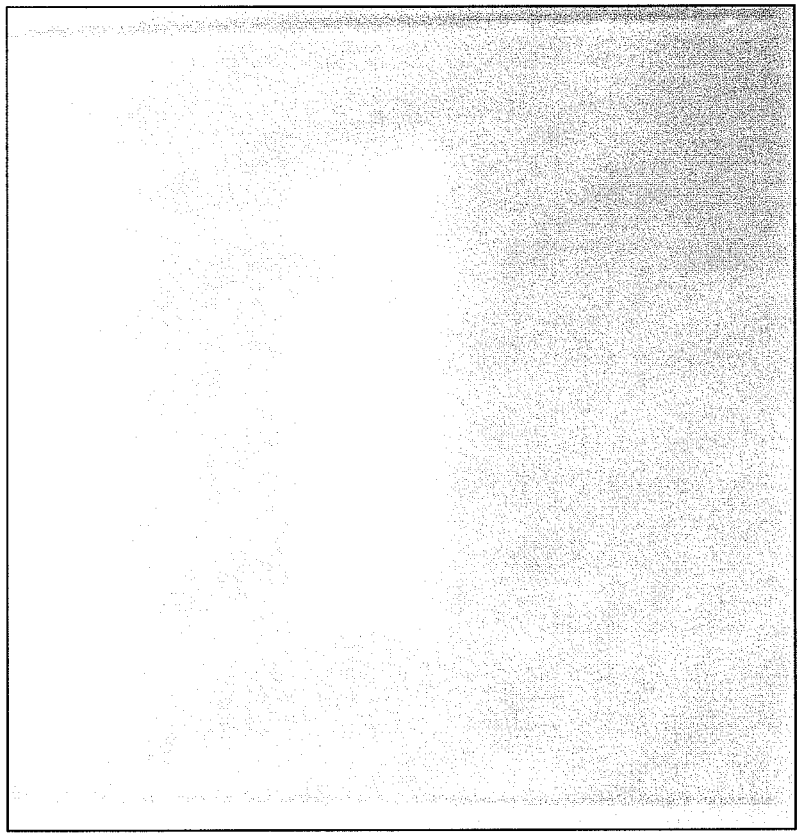
FIG. 5 is an example illustrating a text printed on a 1×1 square inch glass wafer using a target made of a phosphor material.
Figure 5A:
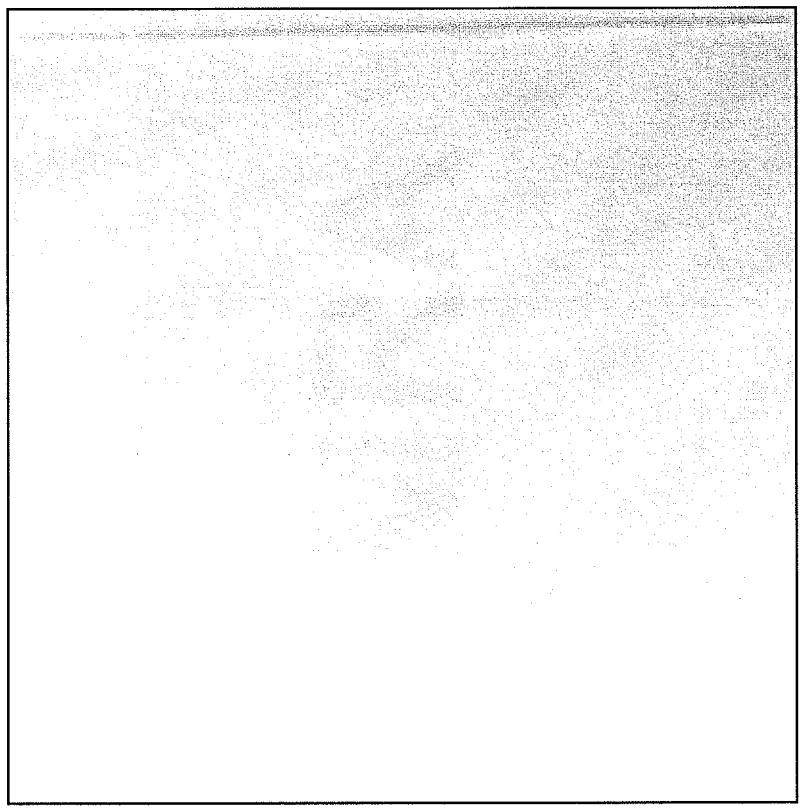

In various embodiments patterns are formed using materials providing functions other than changing the reflection or transmission of light. One example is shown in FIG. 5, where text is printed on a 1×1 square inch glass wafer with a target made of a phosphor material. This material is a white powder under room or sun light, but with UV illumination, the material emits orange luminescence. Using this material as the target, the printed text in FIG. 5(a) is barely visible under room light. In FIG. 5(b), with UV illumination, the text becomes brightly luminescent. This demonstrates that the light emitting property of the original target material is preserved during printing.

In the above implementation, special physical and chemical functions of the target material are preserved, such as phosphorescence or fluorescence properties. Related physical and chemical properties of the original material are not destroyed by laser ablation, although the material is disintegrated with laser irradiation. Ultrashort pulses provide such benefits.

Without subscribing to any particular theory, the process of pulsed laser ablation can generally be separated into several stages, including (i) light absorption, (ii) heating and phase transition, and (iii) plasma expansion. The final material deposition strongly depends on laser parameters including pulse duration, pulse energy, wavelength, and repetition rate, and also on the types of target materials, for example metals or dielectrics. Among these factors, pulse duration is the first to consider and compare between a conventional nanosecond pulsed laser and an ultrashort pulsed laser, because of the large difference of several orders of magnitude.

With a nanosecond pulsed laser such as a Q-switched Nd:YAG, Nd:YLF, or Nd:YVO$_4$ laser, the pulse duration is longer than the time scale of energy exchange between electrons and ions in a solid. The time scale is typically a few tens of picoseconds. The nanosecond laser pulse thermally heats the solid and results in thermal evaporation and ionization, and a plasma is formed by the laser. The tail of the laser pulse can also further heat up the plasma, resulting in a nearly completely atomized and highly ionized vapor plume, except for a few large liquid droplets. In the presence of the ambient air, a strong chemical reaction, e.g., oxidation, is expected during ablation, which will change the physical and chemical properties of the ablated material.

With an ultrashort pulsed laser having a pulse duration in the range of several hundred femtoseconds to a few tens of picoseconds, and with a laser fluence within a range near the ablation threshold, the ablated material can disintegrate into small particles. Such particles may be in the nanometer range, as reported in references No. 1-6 listed below. Several original physical and chemical properties are maintained, such as crystallinity, chemical composition, and alloy composition, as reported in references No. 1-3. Thus, functional properties may be retained. Some examples of functional properties are phosphorescence, electro-luminescence, and selective light absorption and emission for visual color effects. As illustrated in the example of FIG. 5, such properties may be exploited for PLD based microdeposition and pattern formation.

Many possibilities exist for high-repetition rate sources suitable for PLD pattern formation. Ultrashort pulses and various configurations disclosed above provide for precise and repeatable material removal. However, in various embodiments a high repetition rate picosecond or nanosecond source may be utilized. It is known that the effective repetition rate of q-switched sources may be increased by splitting and recombining outputs and/or combining multiple laser outputs. For example, a q-switched laser may have a base repetition rate of 70 KHz that is increased to well over 100 KHz with the multiple lasers and/or splitting and combining. Moreover, semiconductor laser diodes may produce picosecond or nanosecond pulses, and the diodes can be modulated at very high repetition rates, at least tens of MHz. An output of the diode may be amplified with a fiber amplifier to increase the energy level of picosecond or nanosecond pulses to the range of microjoules, for example. Pulse selectors may be used to gate pulses for amplification and delivery to the target. Many possibilities exist.

In various embodiments a metal target will be ablated, and various laser parameters may be pre-selected to control speed and resolution. By way of example, pulsed laser micro-deposition pattern formation may be carried out with pulse widths less than 100 ns, and preferably below 10 ps, at a repetition rate of at least about 100 kHz and much higher. Pulse energy below about 20 µJ provides a fluence of at least about 2.8 $J/cm^2$ in a focused spot diameter of about 30 µm, and suitable for forming various patterns. The fluence is substantially greater than an ablation threshold of many metals. Smaller spot diameters may be utilized. For a given fluence, the required energy decreases with spot area, providing for a potential increase in repetition rate for a given average power, but increased time for scanning. In various embodiments material deposition may be carried out with fluence near the ablation threshold of a metal target.

Thus the inventors have described methods, systems, and a materials for pulsed laser micro-deposition and pattern formation.

At least one embodiment includes a method of pulsed laser deposition to produce a pattern on a medium, the medium being substantially transparent at a wavelength of the pulsed laser. The method includes generating pulsed laser beams from a pulsed laser source, and focusing the pulsed laser beams onto a target. The target produces ejecta in response to an interaction of the pulsed beams and the target. The method includes accumulating at least a portion of the ejecta on the medium to form material deposits on the medium. The method includes controlling thickness of the material deposits to vary an optical density of a region of the medium, and to form a spatial pattern having varying optical density.

In various embodiments:

the method includes transmitting the pulsed laser beams through the medium; scanning the laser beams relative to the medium and target; and varying at least one of a laser beam scan speed and scan line density to control the thickness.

at least a portion of the pattern is characterizable with a one-dimensional thickness profile having a central portion of lower thickness than an immediately adjacent surrounding portion, the thickness of surrounding portion being controlled to vary the optical density.

a pulsed laser source has a repetition rate from about 100 kHz to 100 MHz, and up to about 1 GHz.

a laser pulse has a pulse duration in the range of about from about 10 femtosecond up to about 100 nanosecond.

a laser pulse energy is in the range of about 100 nano-Joule to about 100 micro-Joule.

a medium comprises glass, quartz, sapphire, plastic sheets, or a polymer.

a target comprises a metal, and the metal may comprise steel, aluminum, copper, gold, silver and/or platinum.

a target comprises a non-metal, and the non-metal may comprise carbon, silicon, and/or organics materials such as a polymer.

a target comprises a functional material for emitting light, the function comprising one or more of phosphor luminescence and electro-luminescence.

a target comprises a material for color printing.

a target comprises a structure made of a target material.

a target material is a metal, and the metal may comprise a precious metal.

a target material comprises a dielectric, and the dielectric may comprise a mineral and/or metal oxide.

a laser beam scan speed is varied according the gray scale of the pattern to be printed.

a laser beam scan speed of 1 mm/s -1 m/s is used to produce accumulated deposition of material.

a laser beam scan line density is in a range of 1-100 lines per millimeter.

a medium is placed in contact with the target, placed within 100 micrometers to the target, or placed within 5 mm to the target.

an optical density corresponds to at least three gray levels in a digitized image of the pattern.

a target has a surface with a roughness greater than the wavelength of the laser.

a pattern comprises a bitmap image and/or a vector graphic.

a grey scale image having a discernible feature is obtainable with ambient or controlled illumination of the pattern.

a medium is disposed between the source and the target, and ejecta propagates in reverse to the laser direction.

controlling comprises scanning the pulsed beams and varying the scan speed.

controlling comprises scanning the pulsed beams and varying the line density of the scan.

a medium is positioned relative to the target in such a way to control the spatial resolution of the pattern.

controlling comprises scanning the pulsed beams in one or more of a raster and vector pattern over the target.

at least one pulse width is in the range of about 100 fs to about 10 ps.

At least one embodiment includes a system for pulsed laser deposition to produce a pattern having optical density on a medium, the medium being substantially transparent at a wavelength of the pulsed laser. The system includes a high-repetition rate laser source for generating pulsed laser beams, and a beam delivery system. The beam delivery system includes a focusing sub-system to focus the pulsed laser beams onto a target, the target producing ejecta in response to an interaction of the pulsed beams and the target. At least a portion of the ejecta are accumulated on the medium and form material deposits on the medium. A controller is coupled to the source and the beam delivery system for controlling thickness of material deposits to vary an optical density of a region of the medium. A spatial pattern having varying optical density is formed.

In various embodiments:

a delivery system comprises a beam deflector, and the focusing sub-system comprises a scan lens.

a controller is configured to vary at least one of a laser beam scan speed and scan line density to control thickness.

the medium and target are spaced apart by a gap that provides separation, and the gap may be filled with ambient air, or with flowing dry air, or an inert gas, for example nitrogen or argon. Physical parameters, for example pressure, within the gap may be controlled.

At least one embodiment produces a product, including a medium having a pattern formed thereon. The pattern is formed with a pulsed laser deposition method described above. In various embodiments a pattern corresponds to a gray scale image having at least three detectable gray levels in a digitized image.

At least one embodiment includes a method of pulsed laser deposition to produce a pattern on a medium, the medium being substantially transparent at a wavelength of the pulsed laser. The method includes generating pulsed laser beams from a pulsed laser source, and focusing the pulsed laser beams onto a target. The target produces ejecta in response to an interaction of the pulsed beams and the target. The method includes accumulating at least a portion of the ejecta on the medium to form material deposits on the medium. The deposited material comprises a functional material that is operable to emit radiation in response to a stimulus. The method includes
controlling thickness of the material deposits to vary an optical property of the material deposits.
In various embodiments an optical property of the functional material comprises one or more of phosphorescence, electro-luminescence, and selective light absorption and emission for visual color effects. The stimulus may comprise radiation, for example short wavelength radiation that causes fluorescence excitation.

Thus, while only certain embodiments have been specifically described herein, it will be apparent that numerous modifications may be made thereto without departing from the spirit and scope of the invention. Further, acronyms are used merely to enhance the readability of the specification and claims. It should be noted that these acronyms are not intended to lessen the generality of the terms used and they should not be construed to restrict the scope of the claims to the embodiments described therein.

PUBLICATIONS REFERENCED

1. B. Liu et al., *Appl. Phys. Lett.* 90, 044103 (2007).
2. B. Liu et al., *Proc. SPIE* 6460, 646014 (2007).
3. B. Liu et al., *Laser Focus World*, 43, 74 (2007).
4. S. Eliezer et al., Phys. Rev. B 69, 144119 (2004).
5. S. Amoruso et al., Phys. Rev. B 71, 033406 (2005).
6. T. E. Itina et al., Proc. of SPIE, 6458, pp 64581U-1 (2007).

What is claimed is:

1. A method of pulsed laser deposition to produce a pattern on a medium, said medium being substantially transparent at a wavelength of said pulsed laser, said method comprising:
   generating pulsed laser beams from a pulsed laser source, wherein said pulsed laser source generates pulses at a repetition rate from about 100 kHz to 100 MHz;
   directing said pulsed laser beams through said medium and focusing said pulsed laser beams onto a target during scanning of said pulsed laser beams along a path in a scan direction, said target producing ejecta in response to an interaction of said target and said pulsed laser beams at said repetition rate; and
   accumulating at least a portion of said ejecta on said medium to form material deposits on said medium, and to form a spatial pattern having varying optical density that produces a visual effect of grayscale,
   wherein said interaction causes ejecta to expel sideways relative to said scan direction and to concentrate ejecta toward the periphery of the path of said pulsed beams such that the material deposits are formed with central low thickness portions bounded by immediately adjacent, thicker outer portions,
   wherein said medium and said target are spaced apart by a gap within about 100 μm, or are in direct physical contact, and the thickness of said deposits is controlled with said repetition rate and a scanning speed of said pulsed laser beams.

2. The method of claim 1, comprising:
   varying at least one of a laser beam scan speed and scan line density to control thickness of said deposits.

3. The method of claim 1, wherein said laser pulse has a pulse duration in the range of about 10 femtosecond up to about 100 nanosecond.

4. The method of claim 1, wherein a laser pulse energy is in the range of about 100 nano-Joule to about 100 micro-Joule.

5. The method of claim 1, wherein said medium comprises glass, quartz, sapphire, or a polymer.

6. The method of claim 1, wherein said target comprises a metal.

7. The method of claim 6, wherein said metal comprises steel, aluminum, copper, gold, silver, or platinum.

8. The method of claim 1, wherein said target comprises a non-metal.

9. The method of claim 8, wherein said non-metal comprises carbon, silicon, or a polymer.

10. The method of claim 1, wherein said target comprises a functional material for emitting light, said function comprising one or more phosphor luminescence and electro-luminescence.

11. The method of claim 1, wherein said target comprises a material for color printing.

12. The method of claim 1, wherein said target comprises a structure made of a target material.

13. The method of claim 12, wherein said target material is a metal.

14. The method of claim 13, wherein said metal comprises a precious metal.

15. The method of claim 12, wherein said target material comprises a dielectric.

16. The method of claim 15, wherein said dielectric comprises at least one of a mineral and metal oxide.

17. The method of claim 2, wherein said laser beam scan speed is in the range of about 1 mm/s-about 1 m/s, and utilized to produce accumulated deposition of material.

18. The method of claim 2, wherein said laser beam scan line density is in a range of 1-100 lines per millimeter.

19. The method of claim 1, wherein said optical density corresponds to at least three gray levels in a digitized image of said pattern.

20. The method of claim 1, wherein said target has a surface with a roughness greater than the wavelength of said laser.

21. The method of claim 1, wherein said pattern comprises a bitmap image.

22. The method of claim 1, wherein said pattern comprises a vector graphic.

23. The method of claim 1, wherein a grayscale image having a discernible feature is obtainable with ambient or controlled illumination of said pattern.

24. The method of claim 1, wherein both scanning said pulsed beams and varying the line density of said pulsed beam scan controls thickness of said deposits.

25. The method of claim 1, wherein said medium is positioned relative to said target in such a way to control the spatial resolution of said pattern.

26. The method of claim 1, wherein controlling comprises scanning said pulsed beams in one or more of a raster and vector pattern over said target.

27. The method of claim 1, wherein at least one pulse width is in the range of about 100 fs to about 10 ps.

28. The method of claim 1, wherein an image of said pattern comprises at least ten gray levels.

29. The method of claim 1, wherein said gap is less than about 10 μm.

30. The method of claim 1, wherein said gap is about 1 μm.

31. The method of claim 1, wherein said central portion of low thickness and said immediately adjacent, thicker outer portions form a linewidth of deposited material about 2-3 times the spot width of a focused pulsed laser beam.

32. The method of claim 1, wherein said material deposits comprise a functional material that is operable to emit radiation in response to a stimulus.

33. The method of claim 1, wherein, at a fixed repetition rate in said range, a decrease in scan speed increases the thickness of said immediately adjacent, outer portions.

34. The method of claim 33, wherein an optical property of said functional material comprises one or more of phosphorescence, electro-luminescence, and selective light absorption and emission for visual color effects.

35. The method of claim 33, wherein said stimulus comprises input radiation.

36. The method of claim 33, wherein an image of said pattern comprises at least ten gray levels.

37. The method of claim 33, wherein said gap is less than about 10 μm.

38. The method of claim 33, wherein said gap is about 1 μm.

* * * * *